(12) United States Patent
Nishioka

(10) Patent No.: US 10,115,866 B2
(45) Date of Patent: Oct. 30, 2018

(54) LIGHT EMITTING DEVICE AND PROJECTOR

(71) Applicant: Seiko Epson Corporation, Tokyo (JP)

(72) Inventor: Hiroki Nishioka, Chino (JP)

(73) Assignee: Seiko Epson Corporation (JP)

( * ) Notice: Subject to any disclaimer, the term of this patent is extended or adjusted under 35 U.S.C. 154(b) by 262 days.

(21) Appl. No.: 15/233,121

(22) Filed: Aug. 10, 2016

(65) Prior Publication Data

US 2017/0052435 A1    Feb. 23, 2017

(30) Foreign Application Priority Data

Aug. 17, 2015  (JP) ................. 2015-160340

(51) Int. Cl.
    *G02B 6/10*      (2006.01)
    *H01L 33/44*     (2010.01)
    *H01L 33/00*     (2010.01)
    *G03B 21/20*     (2006.01)
    *H01L 33/20*     (2010.01)

(52) U.S. Cl.
    CPC .......... *H01L 33/44* (2013.01); *G03B 21/2033* (2013.01); *H01L 33/0045* (2013.01); *H01L 33/20* (2013.01)

(58) Field of Classification Search
    CPC ................. G03B 21/2033; H01L 33/0045
    See application file for complete search history.

(56) References Cited

U.S. PATENT DOCUMENTS

| 5,585,957 | A | 12/1996 | Nakao et al. |
| 9,690,178 | B2 * | 6/2017 | Nishioka .............. H01L 33/0045 |
| 2009/0154514 | A1 | 6/2009 | Oh et al. |
| 2011/0298006 | A1 | 12/2011 | Hagino et al. |
| 2011/0303924 | A1 * | 12/2011 | Mochizuki ......... G03B 21/2033 257/76 |
| 2014/0240682 | A1 * | 8/2014 | Nishioka ............ G03B 21/2033 353/98 |
| 2015/0063392 | A1 | 3/2015 | Takayama |

(Continued)

FOREIGN PATENT DOCUMENTS

| JP | 07-231144 A | 8/1995 |
| JP | 2009-152605 A | 7/2009 |

(Continued)

*Primary Examiner* — Sung Pak
(74) *Attorney, Agent, or Firm* — Harness, Dickey & Pierce, P.L.C.

(57) ABSTRACT

In a light emitting device, a ridge section has first and second tapered sections respectively increasing in width from a center position toward first and second light exiting surfaces, and a connection area has third and fourth tapered sections respectively increasing in width from the center position toward the first and second light exiting surfaces. The outer edge angle of the connection area that specifies the third tapered section's width relative to the center line of an optical waveguide is greater than the outer edge angle of the ridge section that specifies the first tapered section's width relative to the center line. The outer edge angle of the connection area that specifies the fourth tapered section's width relative to the center line is greater than the outer edge angle of the ridge section that specifies the second tapered section's width relative to the center line.

12 Claims, 11 Drawing Sheets

(56) References Cited

U.S. PATENT DOCUMENTS

| | | | |
|---|---|---|---|
| 2016/0190385 A1* | 6/2016 | Nishioka | H01L 33/0045 353/85 |
| 2016/0268776 A1* | 9/2016 | Tasai | H01S 5/0202 |
| 2017/0125629 A1* | 5/2017 | Uchida | H01L 33/0045 |
| 2018/0152001 A1* | 5/2018 | Fukuda | H01S 5/1014 |

FOREIGN PATENT DOCUMENTS

| | | |
|---|---|---|
| JP | 2011-253932 A | 12/2011 |
| JP | 5661220 B2 | 1/2015 |
| WO | WO-2013-171950 A1 | 11/2013 |

* cited by examiner

LIGHT EMITTING DEVICE AND PROJECTOR

BACKGROUND

1. Technical Field

The present invention relates to a light emitting device and a projector.

2. Related Art

A semiconductor light emitting device, such as a semiconductor laser and a super luminescent diode (hereinafter also referred to as "SLD"), is used, for example, as a light source of a projector. In the optical waveguide in a semiconductor laser and an SLD, light is amplified along the path toward a light exiting surface through which the light exits. Therefore, in the vicinity of the light exiting surface, gain saturation occurs due to shortage of the amount of carrier to be converted into light, resulting in a decrease in the output in some cases.

For example, WO 2013/171950 describes that in a semiconductor laser, use of a tapered stripe structure, in which the width of the optical waveguide gradually increases in the direction toward the resonator, prevents an extreme bias of the electric field intensity of the light in the direction toward the resonator so that the degree of spatial hole burning is reduced for suppression of the gain saturation. WO 2013/171950 further describes that setting the width of the contact layer to be smaller than the width of the ridge stripe reduces the amount of current injected into the horizontally opposite ends of the ridge stripe so that the degree of spatial hole burning of the carrier in the horizontal direction is suppressed for suppression of the gain saturation.

In WO 2013/171950, however, the amount of current injection is optimized in a semiconductor laser, and the distribution of the amount of current injection optimized in an SLD differs from that in a semiconductor laser.

SUMMARY

An advantage of some aspects of the invention is to provide a light emitting device that is an SLD and capable of a decrease in gain saturation for an increase in output. Another advantage of some aspects of the invention is to provide a projector including the light emitting device.

A light emitting device according to an aspect of the invention includes a laminated body having an active layer capable of producing light when current is injected thereinto and a first cladding layer and a second cladding layer that sandwich the active layer, and a first electrode and a second electrode that inject current into the active layer, the second cladding layer has a ridge section thicker than another portion of the second cladding layer, the active layer forms an optical waveguide that guides light, the optical waveguide has a first light exiting surface and a second light exiting surface through which the light exits, the optical waveguide extends in a direction inclined with respect to a normal to the first light exiting surface and a normal to the second light exiting surface, the laminated body has a connection area that overlaps with the ridge section when viewed in a direction in which the active layer is laminated on the first cladding layer and is connected to the second electrode, the ridge section has a first tapered section having a width that increases with distance from a center position that is equidistant from the first light exiting surface and the second light exiting surface toward the first light exiting surface when viewed from the laminated direction and a second tapered section having a width that increases from the center position toward the second light exiting surface when viewed from the laminated direction, the connection area has a third tapered section having a width that increases from the center position toward the first light exiting surface when viewed from the laminated direction and a fourth tapered section having a width that increases from the center position toward the second light exiting surface when viewed from the laminated direction, an angle of outer edges of the connection area that specify the width of the third tapered section with respect to a center line of the optical waveguide is greater than an angle of outer edges of the ridge section that specify the width of the first tapered section with respect to the center line when viewed from the laminated direction, and an angle of outer edges of the connection area that specify the width of the fourth tapered section with respect to the center line is greater than an angle of outer edges of the ridge section that specify the width of the second tapered section with respect to the center line when viewed from the laminated direction.

In the light emitting device described above, the amount of current in the center position, where the carriers are excessive, can be reduced, and the amount of current in a portion where the carriers are insufficient, can be increased with no increase in the amount of current injected into the entire optical waveguide. The thus configured light emitting device therefore allows a decrease in gain saturation and hence an increase in output.

In the light emitting device according to the aspect of the invention, the laminated body may include a contact layer provided between the second cladding layer and the second electrode, and the contact layer may be connected to the second electrode.

The thus configured light emitting device allows reduction in contact resistance between the laminated body and the second electrode.

In the light emitting device according to the aspect of the invention, the connection area may have a shape symmetry with respect to the center position when viewed from the laminated direction, and the ridge section may have a shape symmetry with respect to the center position when viewed from the laminated direction.

In the thus configured light emitting device, the difference in the intensity between the light that exits through the first light exiting surface and the light that exits through the second light exiting surface can be reduced.

In the light emitting device according to the aspect of the invention, an anti-reflection film may be provided on each of the first light exiting surface and the second light exiting surface.

In the thus configured light emitting device, the amount of light reflected off the first and second light exiting surfaces can be reduced, whereby the light is allowed to efficiently exit through the first and second light exiting surfaces.

In the light emitting device according to the aspect of the invention, the optical waveguide may be formed of a plurality of optical waveguides.

The thus configured light emitting device allows an increase in the output.

A projector according to another aspect of the invention includes the light emitting device according to the aspect of the invention, a light modulator that modulates light emitted from the light emitting device in accordance with image information, and a projection apparatus that projects an image formed by the light modulator.

The projector, which includes the light emitting device according to the aspect of the invention, allows an increase in the luminance of the outputted light.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferable embodiment of the invention will be described below in detail with reference to the drawings. It is not intended that the embodiment described below unduly limits the contents of the invention set forth in the appended claims. Further, all configurations described below are not necessarily essential configuration requirements of the invention.

1. Light Emitting Device

Figure 1:
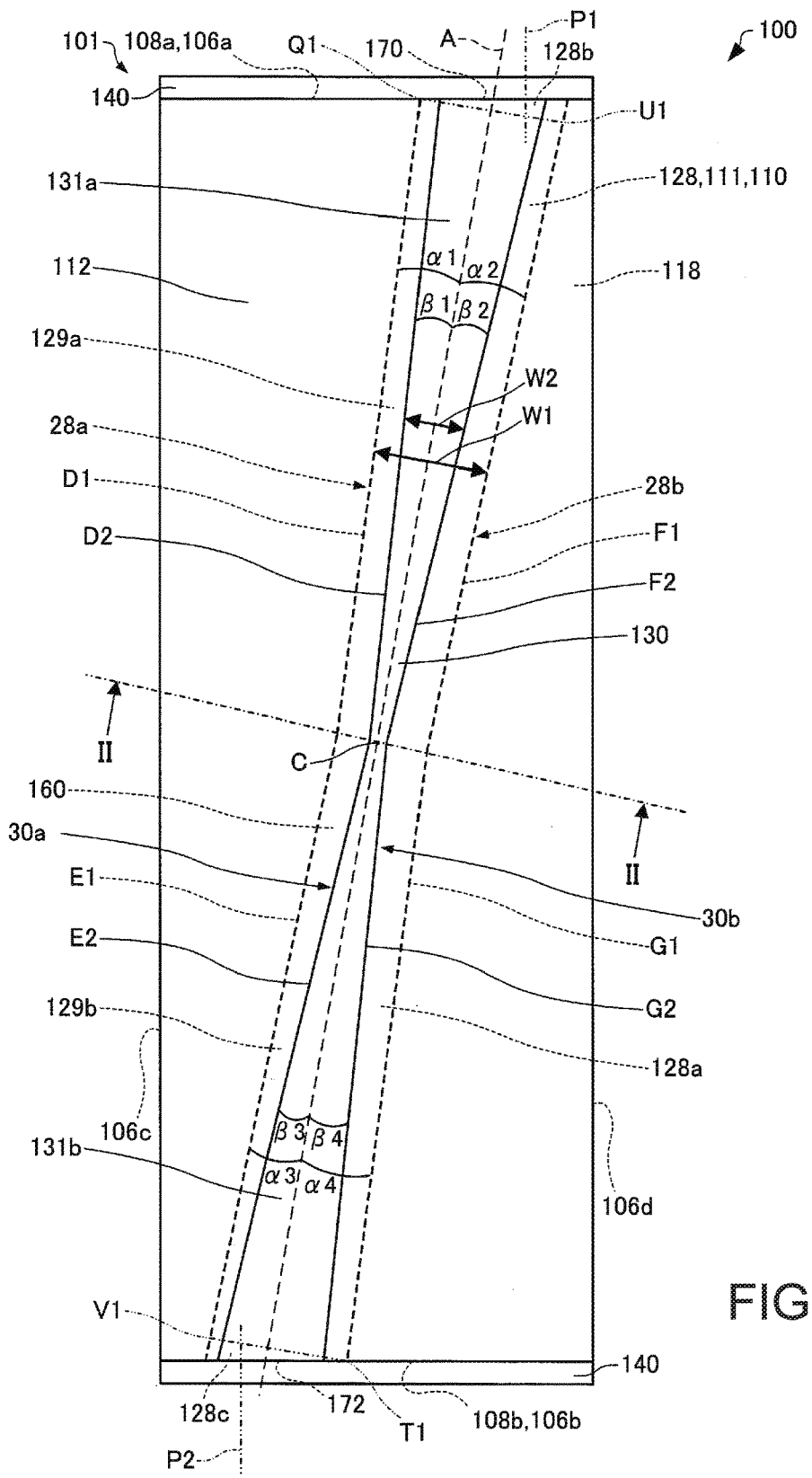
FIG. 1 is a plan view diagrammatically showing a light emitting device according to an embodiment of the invention.
Figure 2:
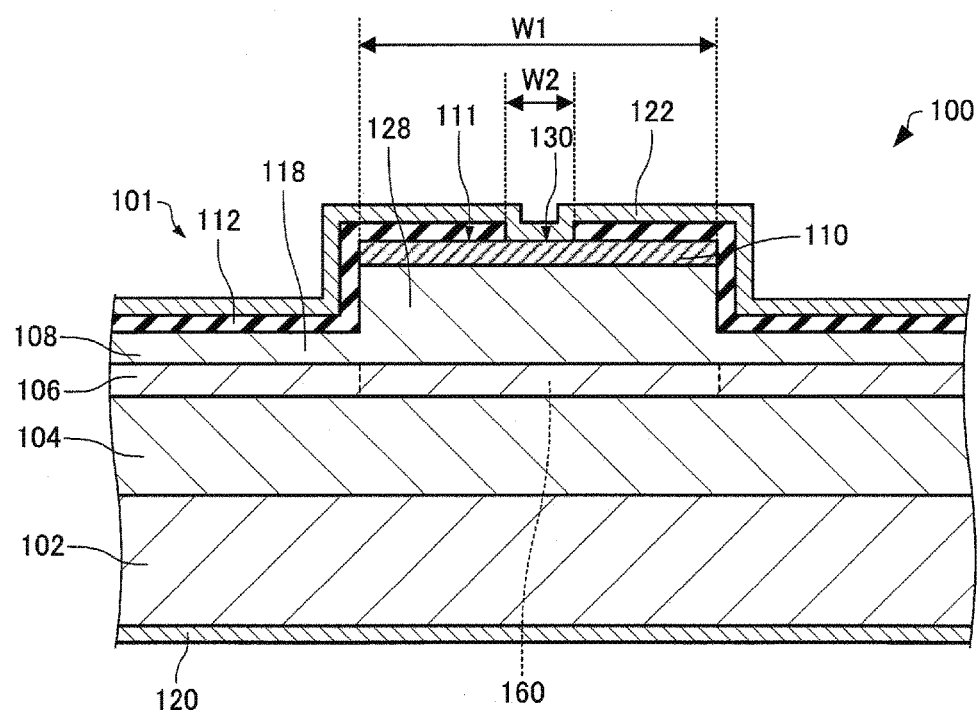
FIG. 2 is a cross-sectional view diagrammatically showing the light emitting device according to the present embodiment.

A light emitting device according to the present embodiment will first be described with reference to the drawings. FIG. 1 is a plan view diagrammatically showing a light emitting device 100 according to the present embodiment. FIG. 2 is a cross-sectional view taken along the line II-II in FIG. 1 and diagrammatically showing the light emitting device 100 according to the present embodiment.

The light emitting device 100 includes a laminated body 101, an insulating layer 112, a first electrode 120, a second electrode 122, and anti-reflection films 140, as shown in FIGS. 1 and 2. The laminated body 101 has a substrate 102, a first cladding layer 104, an active layer 106, a second cladding layer 108, and a contact layer 110. The second electrode 122 is omitted in FIG. 1 for convenience.

The substrate 102 is, for example, a GaAs substrate having a first conductivity type (n-type, for example).

The first cladding layer 104 is provided on the substrate 102. The first cladding layer 104 is, for example, an n-type InGaAlP layer. Although not shown, a buffer layer may be formed between the substrate 102 and the first cladding layer 104. The buffer layer is, for example, an n-type GaAs, AlGaAs, or InGaP layer. The buffer layer allows improvement in crystal quality of a layer formed thereon.

The active layer 106 is provided on the first cladding layer 104. The active layer 106 has, for example, a multiple quantum well (MQW) structure in which three quantum well structures each formed of an InGaP well layer and an InGaAlP barrier layer are laminated on each other.

The active layer 106 has a first side surface 106a, a second side surface 106b, a third side surface 106c, and a fourth side surface 106d, as shown in FIG. 1. The side surfaces 106a and 106b are surfaces facing away from each other (surfaces parallel to each other in the example in FIG. 1). The side surfaces 106c and 106d are surfaces facing away from each other (surfaces parallel to each other in the example in FIG. 1) and connected to the side surfaces 106a and 106b. The side surfaces 106a, 106b, 106c, and 106d are surfaces that are not in surface contact with the cladding layer 104 or 108. Each of the side surfaces 106a and 106b may be a cleavage surface formed by cleavage.

The active layer 106 is a layer capable of producing light when current is injected thereinto. The active layer 106 forms an optical waveguide 160, which guides light. The light guided through the optical waveguide 160 can receive gain in the optical waveguide 160.

The optical waveguide 160 extends from the first side surface 106a to the second side surface 106b when viewed in the direction in which the active layer 106 is laminated on the first cladding layer 104 (also referred to as "in a plan view"). The optical waveguide 160 has a first light exiting surface 170 and a second light exiting surface 172, through which light exits. The first light exiting surface 170 is a portion where the optical waveguide 160 is connected to the first side surface 106a. The second light exiting surface 172 is a portion where the optical waveguide 160 is connected to the second side surface 106b.

The optical waveguide 160 extends in a direction inclined with respect to a normal P1 to the first light exiting surface 170 and a normal P2 to the second light exiting surface 172. In the example shown in FIG. 1, the center line A of the optical waveguide 160 extends in a direction inclined with respect to the normals P1 and P2. The center line A is an imaginary straight line passing through the center of the first light exiting surface 170 and the center of the second light exiting surface 172.

The optical waveguide 160 has a center position C, which is equidistant from the first light exiting surface 170 and the second light exiting surface 172. In the example shown in FIG. 1, the center position C is a point that is equidistant from the light exiting surfaces 170 and 172 and located on the center line A.

The second cladding layer 108 is provided on the active layer 106. The second cladding layer 108 is, for example, an InGaAlP layer having a second conductivity type (p-type, for example). Each of the cladding layers 104 and 108 is a layer having a bandgap greater than that of the active layer 106 but having a refractive index smaller than that of the active layer 106. The cladding layers 104 and 108 sandwich the active layer 106 and has a function of suppressing carrier (electron and hole) injection and light leakage.

The second cladding layer 108 has a fifth side surface 108a, which is continuous with the first side surface 106a of the active layer 106, and a sixth side surface 108b, which is continuous with the second side surface 106b of the active layer 106. The second cladding layer 108 has a ridge section 128, which is thicker than the other portion 118 of the second cladding layer 108. The ridge section 128 extends from the fifth side surface 108a to the sixth side surface 108b. The planar shape of the ridge section 128 (shape in the plan view) is, for example, the same as the planar shape of the optical waveguide 160.

The shape of the ridge section 128 is symmetric (point symmetric) with respect to the center position C in the plan view. The ridge section 128 has a boundary line 28a, which faces the third side surface 106c, (boundary line between ridge section 128 and insulating layer 112, for example) and a boundary line 28b, which faces the fourth side surface 106d, (boundary line between ridge section 128 and insulating layer 112, for example).

Figure 3:
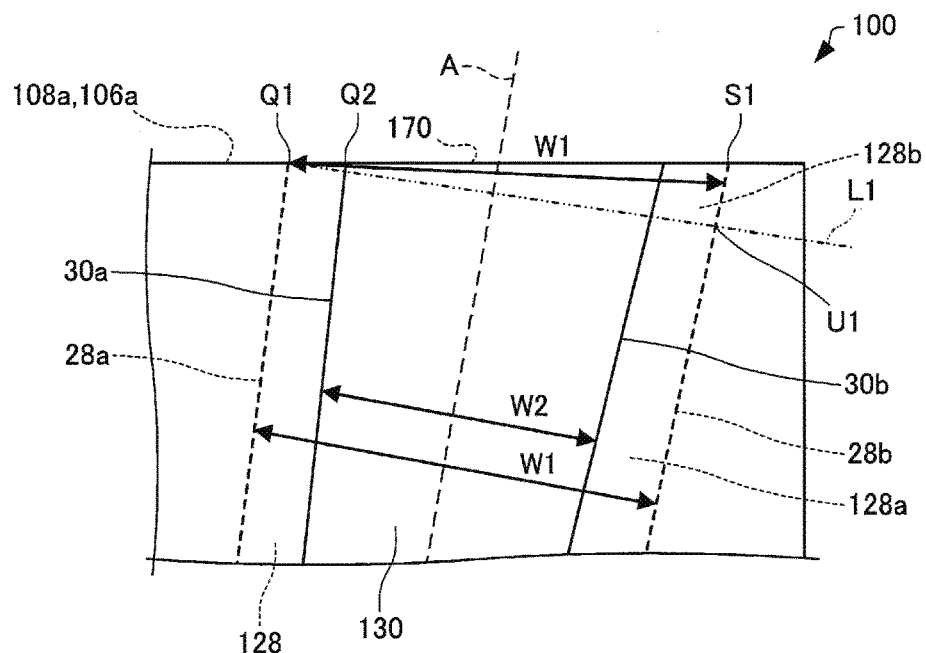
FIG. 3 is a plan view diagrammatically showing the light emitting device according to the present embodiment.
Figure 4:
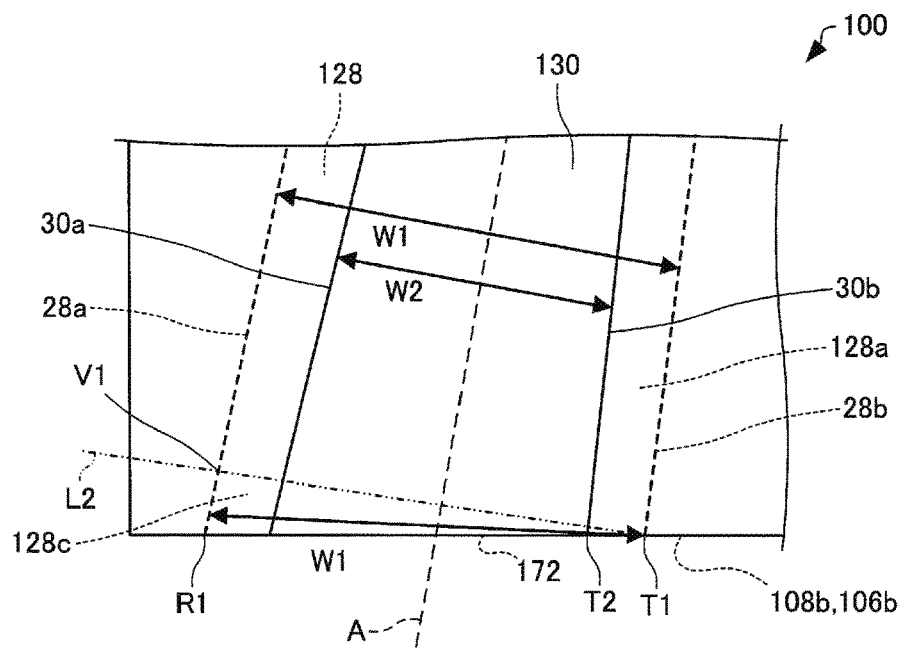
FIG. 4 is a plan view diagrammatically showing the light emitting device according to the present embodiment.

FIG. 3 is an enlarged view of FIG. 1 and diagrammatically shows the vicinity of the first light exiting surface 170. FIG. 4 is an enlarged view of FIG. 1 and diagrammatically shows the vicinity of the second light exiting surface 172. The anti-reflection films 140 are omitted in FIGS. 3 and 4 for convenience.

Let Q1 and R1 be the intersections of the boundary line 28a and the side surfaces 106a, 106b, respectively, as shown in FIGS. 3 and 4. Similarly, let S1 and T1 be the intersections of the boundary line 28b and the side surfaces 106a, 106b, respectively. Further, let U1 be the intersection of an imaginary straight line L1, which passes through the intersection Q1 and is orthogonal to the center line A, and the boundary line 28b. Similarly, let V1 be the intersection of an imaginary straight line L2, which passes through the intersection T1 and is orthogonal to the center line A, and the boundary line 28a.

The ridge section 128 has a first area 128a, a second area 128b, and a third area 128c in the plan view. The first area 128a is an area surrounded by a portion that is part of the boundary line 28a and extends from the intersection Q1 to the intersection V1, a portion that is part of the boundary line 28b and extends from the intersection U1 to the intersection T1, a line segment Q1U1, and a line segment T1V1. The second area 128b is an area surrounded by the line segment Q1U1, a line segment S1U1, and a line segment Q1S1. The third area 128c is an area surrounded by the line segment T1V1, a line segment R1V1, and a line segment R1T1. The planar shape of the first area 128a is, for example, the shape of two trapezoids so connected to each other that the upper sides thereof are connected to each other. The planar shape of each of the second area 128b and the third area 128c is, for example, a triangular shape.

The ridge section 128 has a width W1, which increases with distance from the center position C toward the first light exiting surface 170 and also increases with distance from the center position C toward the second light exiting surface 172 in the plan view.

In a case where a straight line crossing the boundary lines 28a and 28b and orthogonal to the center line A (orthogonal line) can be drawn, for example, in the first area 128a, the width (width in a position along the direction in which the optical waveguide 160 extends) W1 of the ridge section 128 is the length of the orthogonal line between the boundary lines 28a and 28b. On the other hand, in a case where no orthogonal line crossing the boundary lines 28a and 28b and orthogonal to the center line A can be drawn, for example, in the second area 128b and the third area 128c, the width W1 in the second area 128b is the length of the straight line (line segment) drawn from the intersection Q1 to the boundary line 28b, and the width W1 in the third area 128c the length of the straight line (line segment) drawn from the intersection T1 to the boundary line 28a.

The width W1 of the ridge section 128 is minimized in the center position C. The width W1 is maximized, for example, in the positions of the light exiting surfaces 170 and 172. The boundary line 28a of the ridge section 128 is formed, for example, of two straight lines D1 and E1. The boundary line 28b is formed, for example, of two straight lines F1 and G1.

The ridge section 128 has a first tapered section 129a, where the width W1 increases with distance from the center position C toward the first light exiting surface 170, and a second tapered section 129b, where the width W1 increases with distance from the center position C toward the second light exiting surface 172, in the plan view. In the plan view, the first tapered section 129a is a portion between an imaginary straight line (not shown) passing through the center position C and orthogonal to the center line A and the first light exiting surface 170, and the second tapered section 129b is a portion between the imaginary straight line and the second light exiting surface 172.

The straight lines D1 and F1, which form the boundary lines 28a and 28b of the ridge section 128, are outer edges (first outer edge section D1 and second outer edge section F1) of the ridge section 128 that define the width W1 of the first tapered section 129a. The straight lines E1 and G1, which form the boundary lines 28a and 28b, are outer edges (third outer edge section E1 and fourth outer edge section G1) of the ridge section 128 that define the width W1 of the second tapered section 129b. In the plan view, the first outer edge section D1 is inclined with respect to the center line A by an angle $\alpha 1$. The second outer edge section F1 is inclined with respect to the center line A by an angle $\alpha 2$. The third outer edge section E1 is inclined with respect to the center line A by an angle $\alpha 3$. The fourth outer edge section G1 is inclined with respect to the center line A by an angle $\alpha 4$. In the example shown in FIG. 1, the angles $\alpha 1$, $\alpha 2$, $\alpha 3$, and $\alpha 4$ are equal to one another. Each of the angles $\alpha 1$, $\alpha 2$, $\alpha 3$, and $\alpha 4$ is a taper angle of the ridge section 128.

In the light emitting device 100, the p-type second cladding layer 108, the active layer 106, to which no impurity is doped, and the n-type first cladding layer 104 form a pin diode. In the light emitting device 100, when forward bias voltage associated with the pin diode is applied (current is injected) between electrodes 120 and 122, recombination of electrons and holes occurs in the optical waveguide 160. The recombination induces light emission. The produced light serves as an origin, from which stimulated emission successively occurs, whereby the intensity of the light is amplified in the optical waveguide 160. The optical waveguide 160 is formed of the active layer 106, which guides the light, and the cladding layers 104 and 108, which suppress light leakage.

The contact layer 110 is provided on the second cladding layer 108. The contact layer 110 is provided between the ridge section 128 and the second electrode 122. The planar shape of the contact layer 110 is, for example, the same as the planar shape of the ridge section 128. The contact layer 110 is, for example, a p-type GaAs layer. The contact layer 110 is connected to (specifically, is in ohmic contact with)

the second electrode 122. The contact layer 110 is a layer that is more electrically conductive than the cladding layers 104 and 108.

The contact layer 110 and the ridge section 128 form a columnar section 111. The light emitting device 100 is a refractive-index-waveguide-type SLD. In the plan view, the planar shape of the optical waveguide 160 is, for example, the same as the planar shape of the columnar section 111.

The laminated body 101, which is formed of the contact layer 110, the second cladding layer 108, the active layer 106, the first cladding layer 104, and the substrate 102, has a connection area 130, which is connected to the second electrode 122. In the example shown in FIG. 2, the contact layer 110, specifically, the connection area 130 is connected to the second electrode 122. The connection area 130 is a surface where the contact layer 110 is in contact with the second electrode 122, and the connection area 130 is part of the contact layer 110. The connection area 130 overlaps with the ridge section 128 in the plan view.

The shape of the connection area 130 is symmetric (point symmetric) with respect to the center position C in the plan view. The connection area 130 has a boundary line 30a, which faces the third side surface 106c, (boundary line between contact layer 110 and insulating layer 112, for example) and a boundary line 30b, which faces the fourth side surface 106d, (boundary line between contact layer 110 and insulating layer 112, for example). Let Q2 be the intersection of the boundary line 30a and the first side surface 106a, and let T2 be the intersection of the boundary line 30b and the second side surface 106b, as shown in FIGS. 3 and 4.

The connection area 130 has a width W2 that increases with distance from the center position C toward the first light exiting surface 170 and also increases with distance from the center position C toward the second light exiting surface 172 in the plan view.

In a case where a straight line crossing the boundary lines 30a and 30b and orthogonal to the center line A (orthogonal line) can be drawn, the width (width in a position along the direction in which the optical waveguide 160 extends) W2 of the connection area 130 is the length of the orthogonal line between the boundary lines 30a and 30b, as in the case of the width of the ridge section 128 described above. On the other hand, in a case where no orthogonal line crossing the boundary lines 30a and 30b and orthogonal to the center line A can be drawn, the width W2 is the length of the straight line (line segment) drawn from the intersection Q2 to the boundary line 30b or the length of the straight line (line segment) drawn from the intersection T2 to the boundary line 30a.

The width W2 of the connection area 130 is minimized in the center position C. The width W2 is maximized, for example, in the positions of the light exiting surfaces 170 and 172. The boundary line 30a of the connection area 130 is formed, for example, of two straight lines D2 and E2. The boundary line 30b is formed, for example, of two straight lines F2 and G2.

The connection area 130 has a third tapered section 131a, where the width W2 increases with distance from the center position C toward the first light exiting surface 170, and a fourth tapered section 131b, where the width W2 increases with distance from the center position C toward the second light exiting surface 172, in the plan view. In the plan view, the third tapered section 131a is a portion between an imaginary straight line (not shown) passing through the center position C and orthogonal to the center line A and the first light exiting surface 170, and the fourth tapered section 131b is a portion between the imaginary straight line and the second light exiting surface 172.

The straight lines D2 and F2, which form the boundary lines 30a and 30b of the connection area 130, are outer edges (fifth outer edge section D2 and sixth outer edge section F2) of the connection area 130 that define the width W2 of the third tapered section 131a. The straight lines E2 and G2, which form the boundary lines 30a and 30b, are outer edges (seventh outer edge section E2 and eighth outer edge section G2) of the connection area 130 that define the width W2 of the fourth tapered section 131b. In the plan view, the fifth outer edge section D2 is inclined with respect to the center line A by an angle β1. The sixth outer edge section F2 is inclined with respect to the center line A by an angle β2. The seventh outer edge section E2 is inclined with respect to the center line A by an angle β. The eighth outer edge section G2 is inclined with respect to the center line A by an angle β4. In the example shown in FIG. 1, the angles β1, β2, β3, and β4 are equal to one another. Each of the angles β1, β2, β3, and β4 is a taper angle of the connection area 130.

In the plan view, the angle β1 of the fifth outer edge section D2 of the connection area 130, which defines the width W2 of the third tapered section 131a, with respect to the center line A is greater than the angle α1 of the first outer edge section D1 of the ridge section 128, which defines the width W1 of the first tapered section 129a, with respect to the center line A. Similarly, the angles β2, β3, and β4 are greater than the angles α2, α3, and α4, respectively.

The insulating layer 112 is provided on the upper surface of the second cladding layer 108, the side surfaces of the columnar section 111 (circumference of columnar section 111 in the plan view), and part of the upper surface of the columnar section 111, as shown in FIG. 2. In the example shown in FIG. 2, the planar shape of the connection area 130 is determined by the planar shape of an opening of the insulating layer 112 provided on the upper surface of the columnar section 111. The insulating layer 112 is, for example, an SiN layer, an SiO$_2$ layer, an SiON layer, an Al$_2$O$_3$ layer, or a polyimide layer. When the insulating layer 112 is made of any of the materials described above, the current flowing through the portion between the electrodes 120 and 122 avoids the insulating layer 112 but flows through the columnar section 111 sandwiched by the portions of the insulating layer 112. The insulating layer 112 has a refractive index, for example, smaller than the refractive index of the second cladding layer 108.

The first electrode 120 is provided below the substrate 102. The first electrode 120 is provided on the lower surface of a layer that is in ohmic contact with the first electrode 120 (substrate 102 in the example shown in FIG. 2). The first electrode 120 is one electrode for driving the light emitting device 100 (injecting current into active layer 106). The first electrode 120 is, for example, a laminate in which a Cr layer, an AuGe layer, an Ni layer, and an Au layer are laminated on each other in this order from the side facing the first cladding layer 104.

The second electrode 122 is provided above the ridge section 128. Specifically, the second electrode 122 is provided on the contact layer 110 and on the insulating layer 112. The second electrode 122 is the other electrode for driving the light emitting device 100 (injecting current into active layer 106). The second electrode 122 is, for example, a laminate in which a Cr layer, an AuZn layer, and an Au layer are laminated on each other in this order from the side facing the contact layer 110.

The anti-reflection (AR) films 140 are provided on the light exiting surfaces 170 and 172. In the example shown in FIG. 1, the anti-reflection films 140 are provided on the side surfaces 106a and 106b. Each of the anti-reflection films 140 is, for example, an $SiO_2$ layer, a $Ta_2O_5$ layer, an $Al_2O_3$ layer, a TiN layer, a $TiO_2$ layer, an SiON layer, an SiN layer, or a multilayer film formed thereof.

The above description has been made of the light emitting device 100 made of an AlGaInP-based material, but any material that allows formation of the light emitting device and the optical waveguide according to the embodiment of the invention can be used. Examples of usable semiconductor materials may include AlGaN-based, GaN-based, InGaN-based, GaAs-based, AlGaAs-based, InGaAs-based, InGaAsP-based, InP-based, GaP-based, AlGaP-based, and ZnCdSe-based semiconductor materials.

The light emitting device 100 can be used, for example, as the light source of a projector, a display, an illuminator, and a measurement apparatus.

The light emitting device 100 has, for example, the following features.

In the light emitting device 100, the ridge section 128 has the first tapered section 129a and the second tapered section 129b, the connection area 130 has the third tapered section 131a and the fourth tapered section 131b, and the angles β1, β2, β3, and β4 are greater than the angles α1, α2, α3, and α4, respectively, in the plan view. The thus configured light emitting device 100 aims to provide a light emitting device capable of a decrease in gain saturation for an increase in output. The reason for this will be described below.

Figure 5:
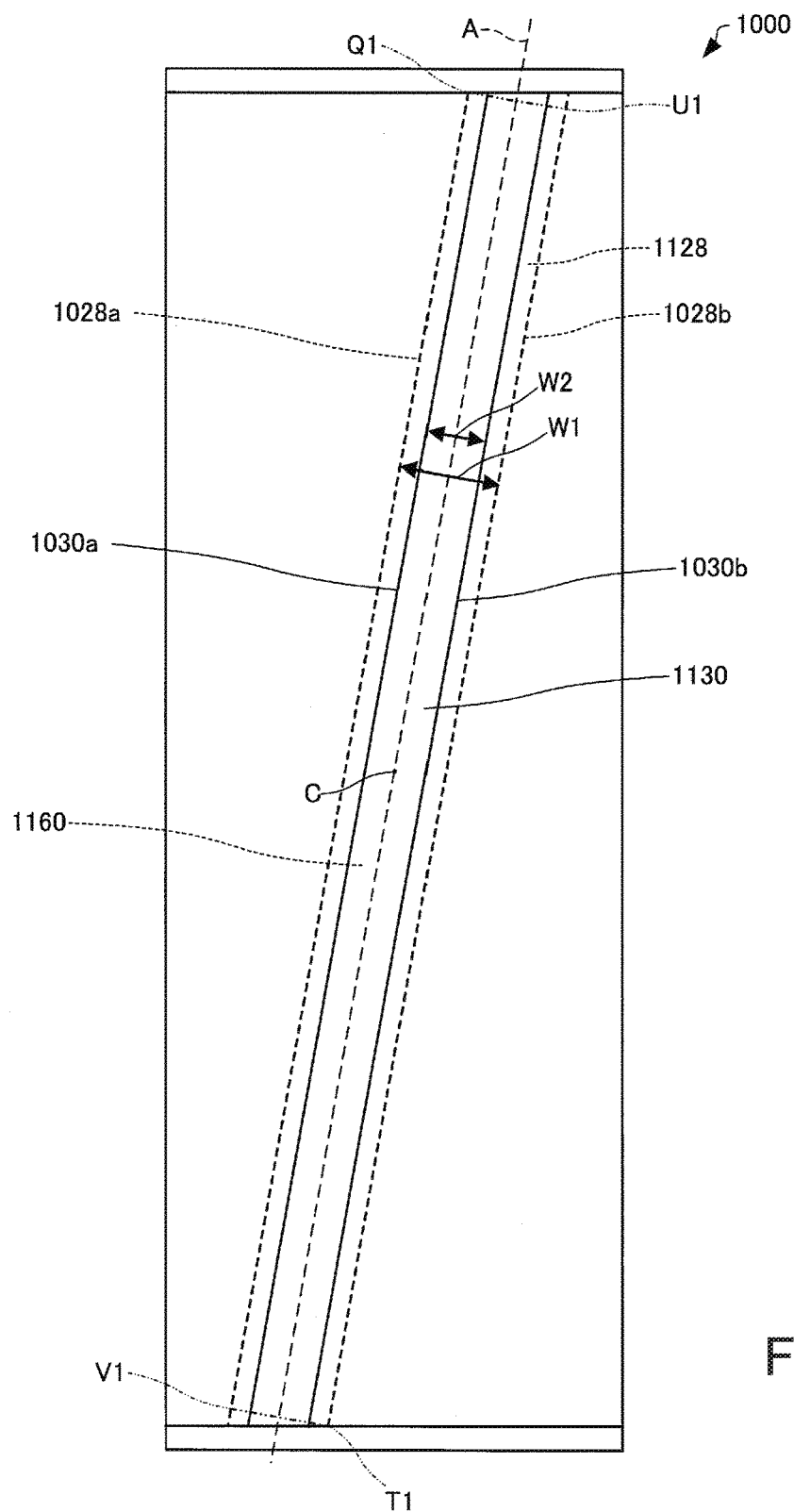
FIG. 5 is a plan view diagrammatically showing a light emitting device according to a reference example.
Figure 6:
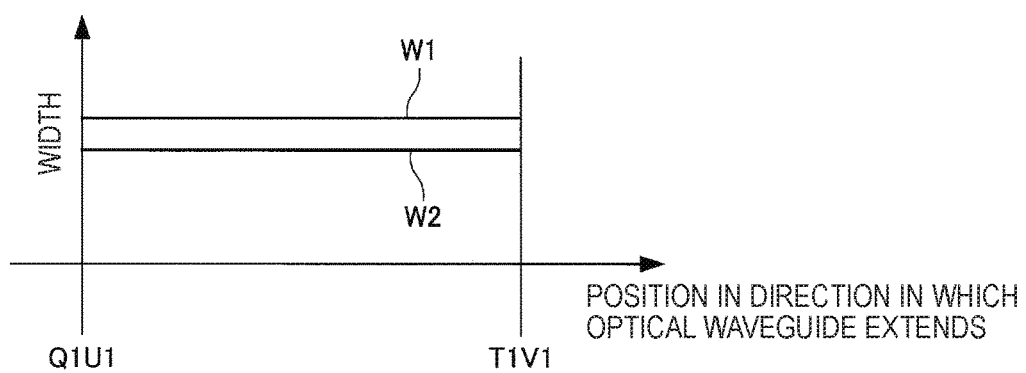
FIG. 6 shows graphs for describing the relationship between the position in the direction in which the optical waveguide extends and the width of the optical waveguide.

FIG. 5 is a plan view diagrammatically showing a light emitting device 1000, in which boundary lines 1028a and 1028b of a ridge section 1128 and boundary lines 1030a and 1030b of a connection area 1130 are parallel to the center line A of an optical waveguide 1160. In the light emitting device 1000, the width W1 of the connection area 1130 and the width W2 of the ridge section 1128 are fixed in the direction in which the optical waveguide 1160 extends between the position of the line segment Q1U1 and the line segment T1V1, as shown in FIG. 6.

Figure 7:
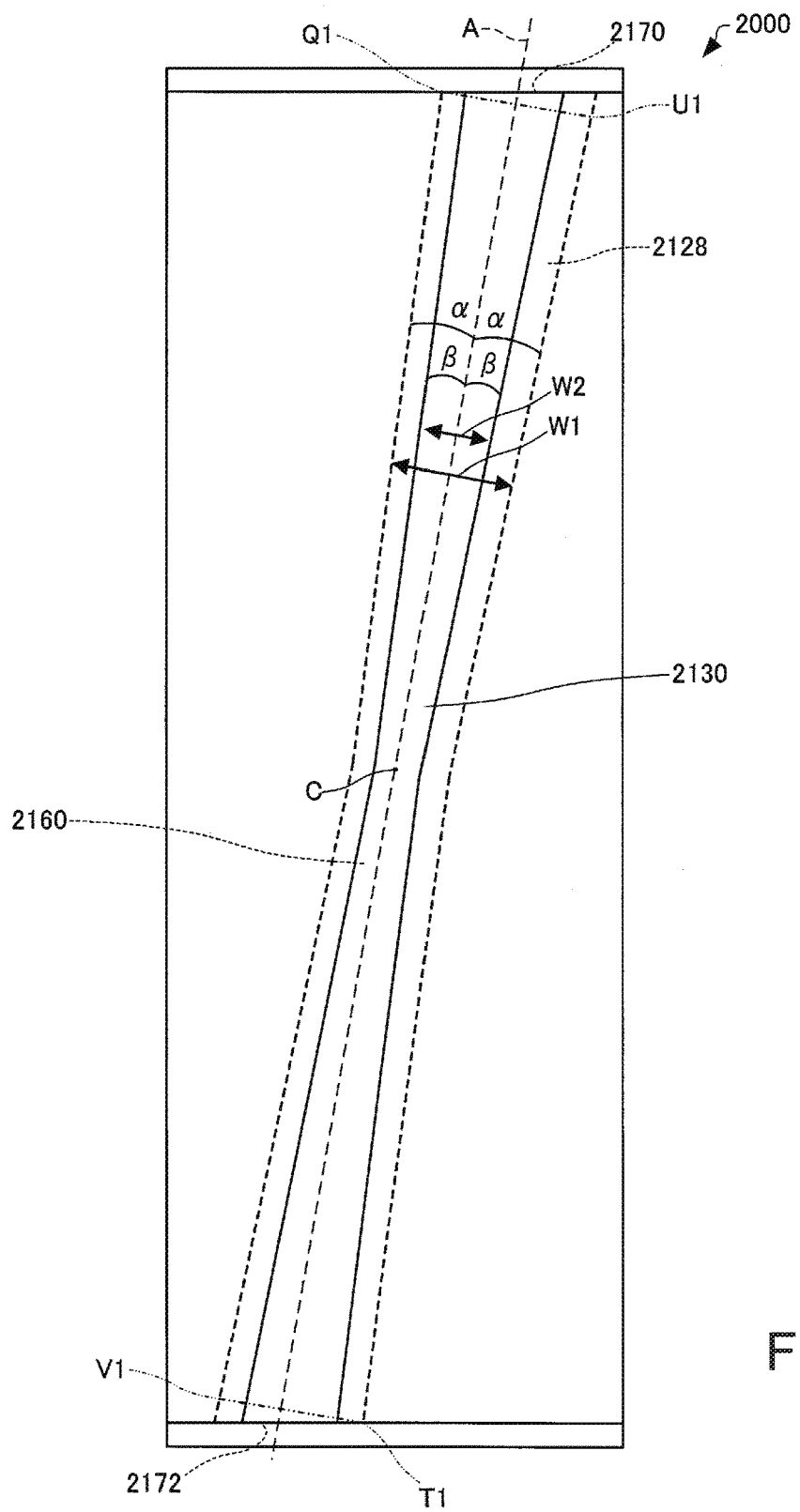
FIG. 7 is a plan view diagrammatically showing a light emitting device according to another reference example.
Figure 8:
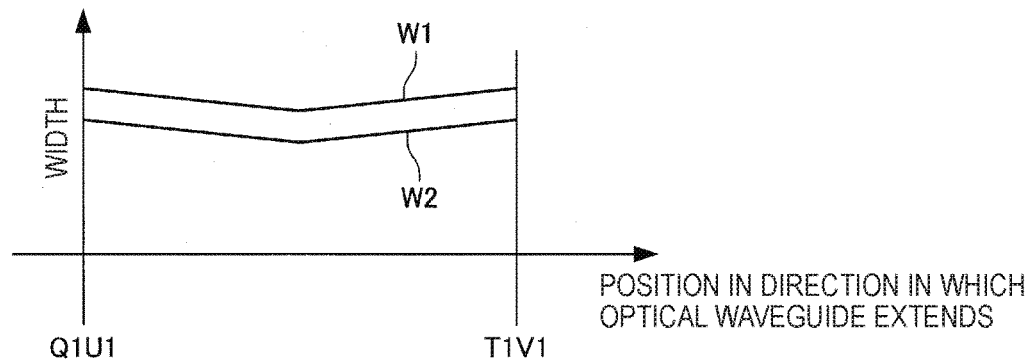
FIG. 8 shows graphs for describing the relationship between the position in the direction in which the optical waveguide extends and the width of the optical waveguide.

FIG. 7 is a plan view diagrammatically showing a light emitting device 2000, in which the widths W1 and W2 of a ridge section 2128 and a connection area 2130 increase with distance from the center position C toward a first light exiting surface 2170 and also increase with distance from the center position C toward a second light exiting surface 2172. In the light emitting device 2000, a taper angle β of the connection area 2130 with respect to the center line A of an optical waveguide 2160 is equal to a taper angle α of the ridge section 2128 with respect to the center line A. The gradient of the graph representing the width W1 of the ridge section 2128 is therefore equal to the gradient of the graph representing the width W2 of the connection area 2130 in the direction in which the optical waveguide 2160 extends, as shown in FIG. 8.

Figure 9:
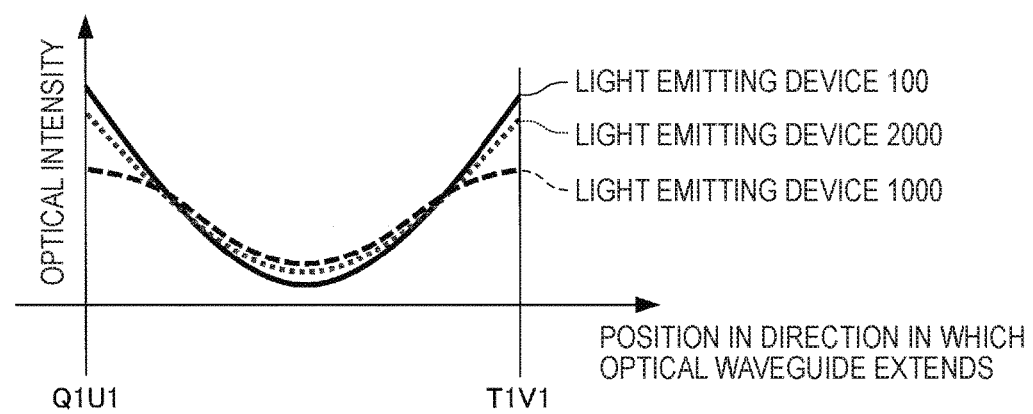
FIG. 9 shows graphs for describing the relationship between the position in the direction in which the optical waveguide extends and the optical intensity in the optical waveguide.

FIG. 9 describes the relationship between the position in the direction in which the optical waveguide extends (light propagation direction) and the optical intensity in the light emitting devices 100, 1000, and 2000. The horizontal axis of FIG. 9 represents the position in the direction in which the optical waveguide extends between the position of the line segment Q1U1 and the line segment T1V1. The optical intensity along the vertical axis of FIG. 9 means the number of photons that pass, in a position on the direction in which the optical waveguide extends and per unit time, through a cross section orthogonal to the direction in which the optical waveguide extends.

In an SLD, light is exponentially amplified along the path toward each light exiting surface (side where reflectance is small). The optical intensity is therefore non-uniformly distributed in the direction in which the optical waveguide extends, as shown in FIG. 9. Therefore, when the amount of current per unit length is fixed in the direction in which the optical waveguide extends, for example, as in the light emitting device 1000, the number of carriers relatively runs short of the amount of light (number of photons) in the vicinity of each light exiting surface. That is, in the stage of the light amplification, the number of carriers to be converted into light is insufficient. As a result, gain saturation occurs on each light exiting surface side where the optical intensity is greater (side facing line segment Q1U1 and side facing line segment T1V1), and the optical output decreases accordingly. The amount of current per unit length is the amount of current flowing in a position along the direction in which the optical waveguide extends and in the layering direction (direction in which active layer 106 is laminated on first cladding layer 104, for example).

In a portion where the optical intensity is low (center position C, for example), the number of carriers is greater than that on each light exiting surface side, and the carriers are not fully converted into light so that extra carriers are present. Therefore, injecting current that produces such excess carriers to each light exiting surface side where the number of carriers is insufficient allows high-output, high-efficient drive operation. That is, changing the amount of current per unit length allows a decrease in gain saturation and hence an increase in the final optical output with the amount of injected current across the entire optical waveguide maintained.

In the light emitting device 100, the connection area 130 has the third tapered section 131a and the fourth tapered section 131b, as described above. The amount of current per unit length of the optical waveguide 160 can therefore be increased, with distance from the center position C toward the light exiting surfaces 170 and 172, in the direction in which the optical waveguide 160 extends between the position of the line segment Q1U1 and the position of the line segment T1V1 in the plan view.

Figure 10:
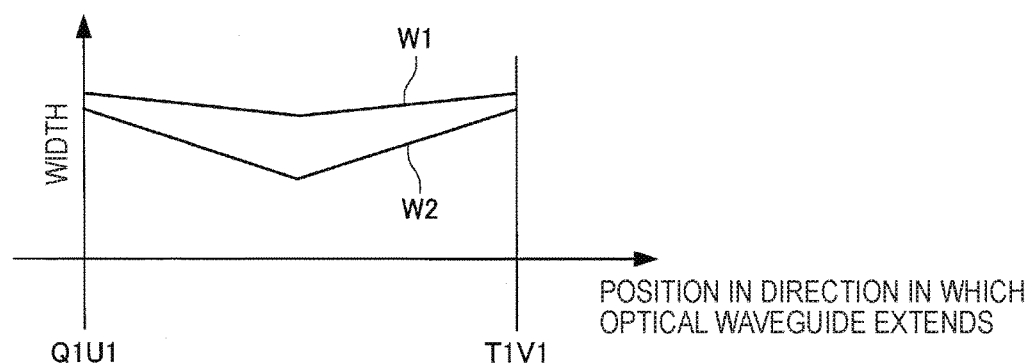
FIG. 10 shows graphs for describing the relationship between the position in the direction in which the optical waveguide extends and the width of the optical waveguide.

Further, in the light emitting device 100, the ridge section 128 has the first tapered section 129a and the second tapered section 129b, and the angles β1, β2, β, and β4 are greater than the angles α1, α2, α3, and α4, respectively. Therefore, in the direction in which the optical waveguide 160 extends, the gradient of the graph representing the width W2 of the connection area 130 is greater than the gradient of the graph representing the width W1 of the ridge section 128, as shown in FIG. 10. As a result, in the light emitting device 100, the amount of current in the center position C, where the carriers are excessive, can be reduced, and the amount of current in the line segments Q1S1 and S1T1, where the carriers are insufficient, can be increased with no increase in the amount of current injected into the entire optical waveguide 160, as compared with the case where the taper angle β is equal to the taper angle α (as compared with light emitting device 2000). The light emitting device 100 therefore allows a decrease in gain saturation and hence an increase in the output in an efficient manner as compared with the light emitting device 2000 (FIG. 9).

Figure 11:
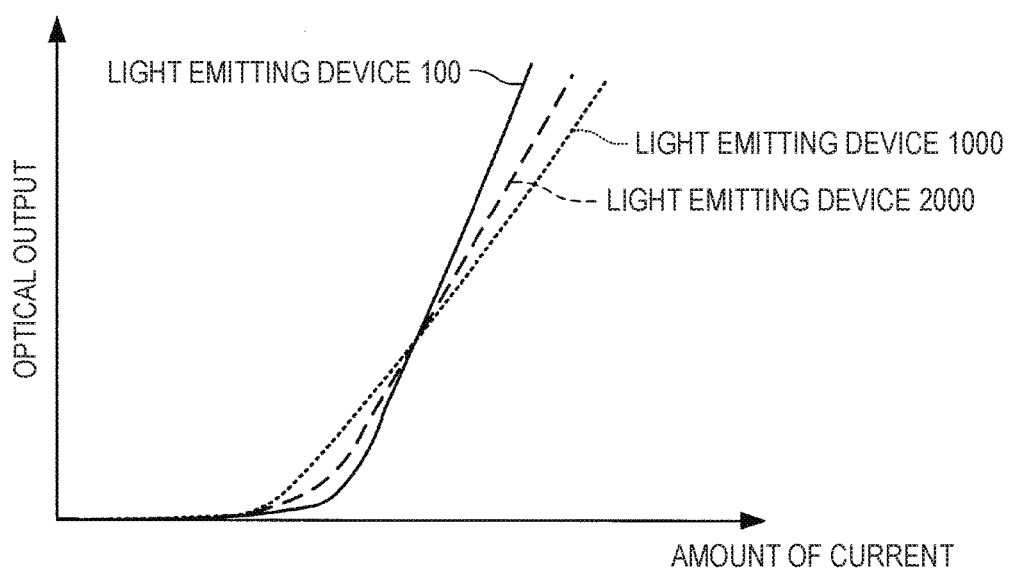
FIG. 11 shows graphs for describing the relationship between the amount of current and optical output.

FIG. 11 shows graphs for describing the relationship between the amount of current injected into the optical waveguide and the optical output in the light emitting devices 100, 1000, and 2000. The light emitting device 100 has good slope efficiency in a high output area (area where a large amount of current is injected) as compared with the light emitting devices 1000 and 2000. The light emitting device 100 can therefore efficiently operate particularly in the high output area.

In the light emitting device 100, the amount of current that allows initiation of optical output (threshold amount of current) is greater than those in the light emitting devices 1000 and 2000 in some cases. The reason for this is that in the light emitting device 100, the difference in shape between the optical waveguide 160 and the connection area 130, into which current is injected, in the plan view is greater than in the light emitting devices 1000 and 2000.

Further, in the light emitting device 100, the optical waveguide 160 extends in a direction inclined with respect to the normal P1 to the first light exiting surface 170 and the normal P2 to the second light exiting surface 172. The light emitting device 100 can therefore prevent the light produced in the optical waveguide 160 from undergoing direct multiple reflection between the light exiting surfaces 170 and 172. As a result, the light emitting device 100 can prevent direct formation of a resonator and can therefore prevent laser oscillation of the light produced in the optical waveguide 160. As a result, the light emitting device 100 allows reduction in speckle noise. The light emitting device 100 is therefore an SLD.

In the light emitting device 100, the laminated body 101 has the contact layer 110, which is provided between second cladding layer 108 and the second electrode 122. The light emitting device 100 therefore allows reduction in contact resistance between the laminated body 101 and the second electrode 122.

In the light emitting device 100 in the plan view, the shape of the connection area 130 is symmetric with respect to the center position C, and the shape of the ridge section 128 is symmetric with respect to the center position C. As a result, in the light emitting device 100, for example, the difference in the intensity between the light that exits through the first light exiting surface 170 and the light that exits through the second light exiting surface 172 can be reduced.

In the light emitting device 100, the anti-reflection film 140 is provided on each of the light exiting surfaces 170 and 172. Therefore, in the light emitting device 100, the amount of light reflected off the light exiting surfaces 170 and 172 can be reduced, whereby the light is allowed to efficiently exit through the light exiting surfaces 170 and 172.

Although not shown, in a case where the angles α1 and α2 differ from each other and in a case where the angles β1 and β2 differ from each other, the light emitting device according to the embodiment of the invention may be so configured that one of relationships β1>α1 and β2>α2 is satisfied or both the relationships are satisfied. Further, although not shown, in a case where the angles α3 and α4 differ from each other and in a case where the angles β3 and β4 differ from each other, the light emitting device according to the embodiment of the invention may be so configured that one of relationships β3>α3 and β4>α4 is satisfied or both the relationships are satisfied.

2. Method for Manufacturing Light Emitting Device

Figure 12:
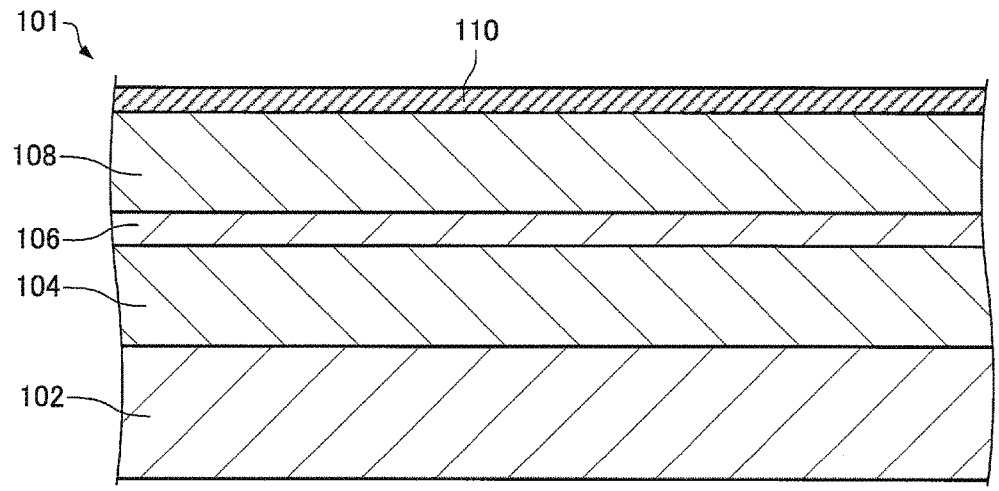
FIG. 12 is a cross-sectional view diagrammatically showing a step of manufacturing the light emitting device according to the present embodiment.
Figure 13:
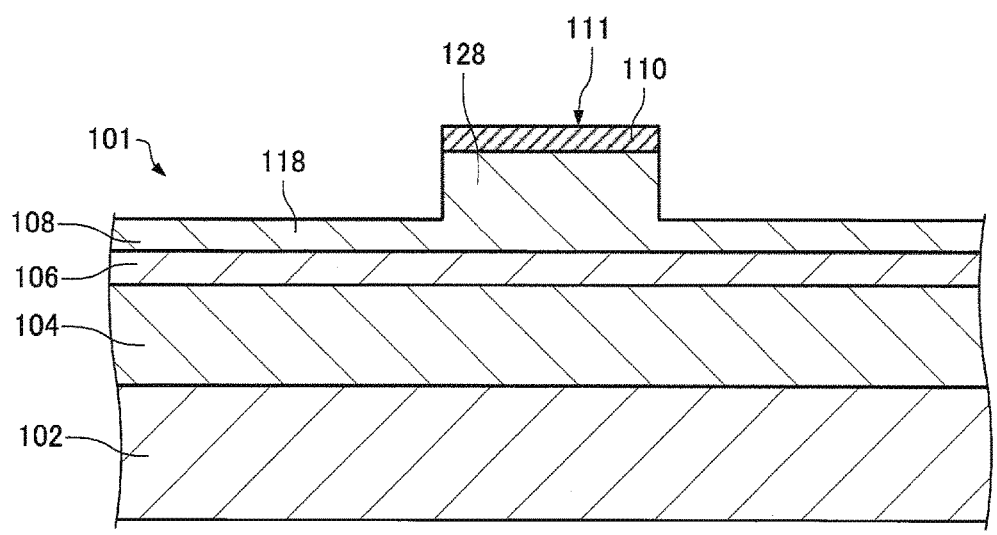
FIG. 13 is a cross-sectional view diagrammatically showing another step of manufacturing the light emitting device according to the present embodiment.

A method for manufacturing the light emitting device 100 according to the present embodiment will next be described with reference to the drawings. FIGS. 12 and 13 are cross-sectional views diagrammatically showing steps of manufacturing the light emitting device 100 according to the present embodiment.

The first cladding layer 104, the active layer 106, the second cladding layer 108, and the contact layer 110 are formed on the substrate 102 in this order in epitaxial growth, as shown in FIG. 12. The laminated body 101 is thus formed.

Examples of the epitaxial growth method may include an MOCVD (metal organic chemical vapor deposition) method and an MBE (molecular beam epitaxy) method.

The contact layer 110 and the second cladding layer 108 are so patterned that the columnar section 111 is formed, as shown in FIG. 13. The patterning is performed, for example, by photolithography and etching. The etching of the contact layer 110 and the second cladding layer 108 may be performed simultaneously or separately.

The insulating layer 112 is so formed as to cover the side surfaces of the columnar section 111, as shown in FIG. 2. Specifically, the insulating layer 112 is formed by deposition of an insulating material (not shown) in a CVD (chemical vapor deposition) method (more specifically, plasma CVD method), an application method, or any other method and patterning of the insulating material. The patterning is performed, for example, by photolithography and etching.

The second electrode 122 is then formed on the contact layer 110. The first electrode 120 is then formed on the lower surface of the substrate 102. The electrodes 120 and 122 are formed, for example, by using a vacuum evaporation method or a sputtering method. The order in which the electrodes 120 and 122 are formed is not limited to a specific order.

The anti-reflection film 140 is formed on each of the light exiting surfaces 170 and 172, as shown in FIG. 1. The anti-reflection films 140 are formed, for example, by using a CVD method or a sputtering method. The anti-reflection films 140 may instead be formed before the formation of the electrodes 120 and 122.

The light emitting device 100 can be manufactured by carrying out the steps described above.

3. Variation of Light Emitting Device

Figure 14:
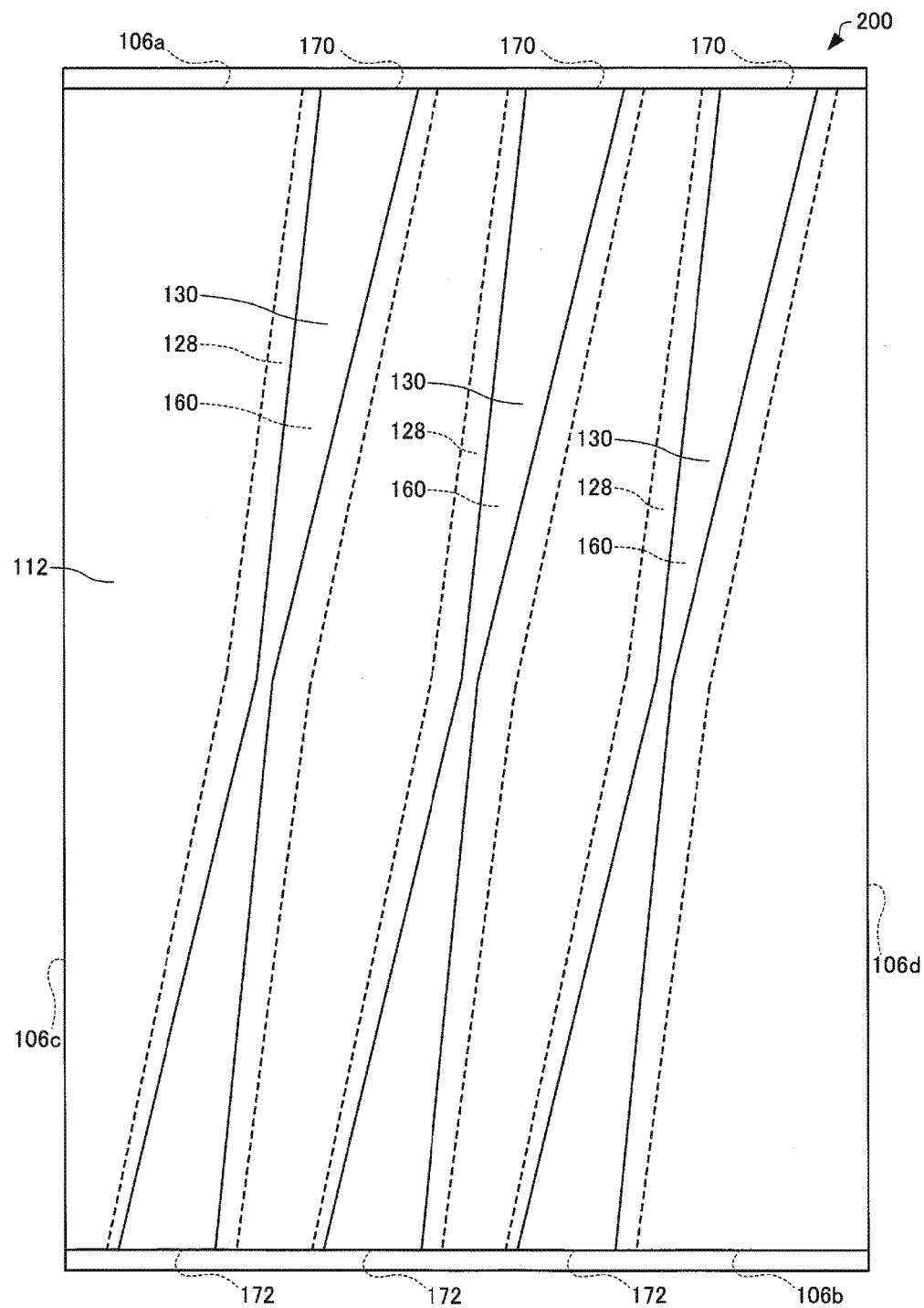
FIG. 14 is a plan view diagrammatically showing a light emitting device according to a variation of the present embodiment.

A light emitting device according to a variation of the present embodiment will next be described with reference to the drawings. FIG. 14 is a plan view diagrammatically showing a light emitting device 200 according to the variation of the present embodiment. In FIG. 14, the second electrode 122 is omitted for convenience.

In the following description, in the light emitting device 200 according to the variation of the present embodiment, members having the same functions as those of the members that form the light emitting device 100 according to the present embodiment have the same reference characters and will not be described in detail.

The light emitting device 100 described above has one optical waveguide 160, as shown in FIG. 1. In contrast, the light emitting device 200 has a plurality of optical waveguides 160, as shown in FIG. 14. In the example shown in FIG. 14, the light emitting device 200 has three optical waveguides 160. The plurality of optical waveguides 160 are arranged along the direction from the third side surface 106c of the active layer 106 toward the fourth side surface 106d thereof in the plan view.

The light emitting device 200 also allows a decrease in the gain saturation and hence an increase in the output, as in the light emitting device 100. Further, the light emitting device 200, in which a plurality of optical waveguides 160 are arranged, allows a further increase in the output.

4. Projector

Figure 15:
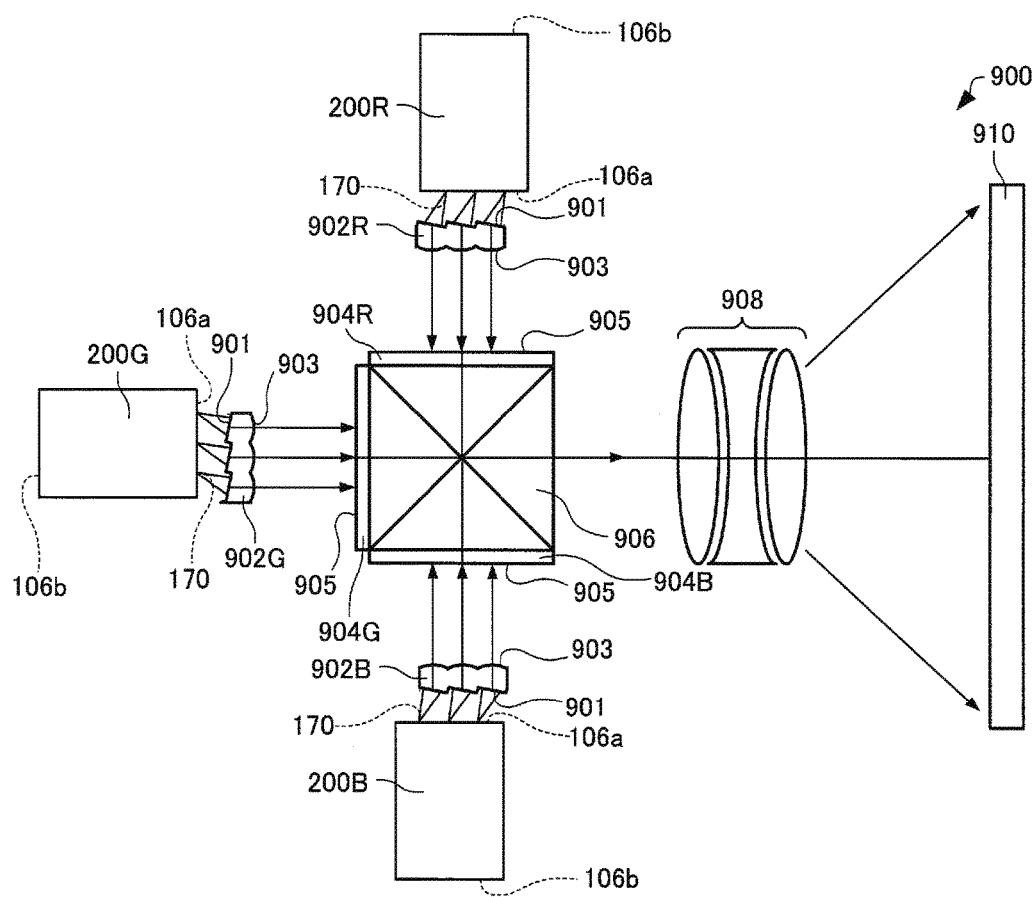
FIG. 15 diagrammatically shows a projector according to the present embodiment.

A projector according to the present embodiment will next be described with reference to the drawings. FIG. 15 diagrammatically shows a projector 900 according to the present embodiment.

The projector 900 includes a red light source 200R, a green light source 200G, and a blue light source 200B, which emit red light, green light, and blue light, respectively, as shown in FIG. 15. Each of the red light source 200R, the green light source 200G, and the blue light source 200B is the light emitting device according to an aspect of the invention. In the following description, the light emitting device 200 is used as the light emitting device according to the aspect of the invention. In FIG. 15, an enclosure that forms the projector 900 is omitted, and the light sources 200R, 200G, and 200B are simplified for convenience.

The projector 900 further includes lens arrays 902R, 902G, and 902B, transmissive liquid crystal light bulbs (light modulators) 904R, 904G, and 904B, and a projection lens (projection apparatus) 908.

The light fluxes emitted from the light sources 200R, 200G, and 200B are incident on the lens arrays 902R, 902G, and 902B. The lens arrays 902R, 902G, and 902B have light incident surfaces 901, which face the light sources 200R, 200G, and 200B and on which the light fluxes having exited through the first light exiting surfaces 170 are incident. Each of the light incident surfaces 901 is, for example, a flat surface. The plurality of light incident surfaces 901 correspond to the plurality of first light exiting surfaces 170 and are arranged at equal intervals. A normal (not shown) to each of the light incident surfaces 901 is inclined with respect to the first side surface 106a. The light incident surfaces 901 allow the optical axes of the light fluxes that exit through the first light exiting surfaces 170 to be orthogonal to light irradiation surfaces 905 of the liquid crystal light bulbs 904R, 904G, and 904B.

The lens arrays 902R, 902G, and 902B have light exiting surfaces 903 on the side facing the liquid crystal light bulbs 904R, 904G, and 904B. Each of the light exiting surfaces 903 is, for example, a convex surface. The plurality of light exiting surfaces 903 correspond to the plurality of light incident surfaces 901 and are arranged at equal intervals. The light fluxes the optical axes of which are converted at the light incident surfaces 901 are focused by the light exiting surfaces 903 or caused to diffuse at a smaller angle and (partially) superimposed on one another. The liquid crystal light bulbs 904R, 904G, and 904B can thus be uniformly irradiated with the light.

As described above, the lens arrays 902R, 902G, and 902B can control the optical axes of the light fluxes having exited through the first light exiting surfaces 170 to focus the light fluxes.

The light fluxes focused by the lens arrays 902R, 902G, and 902B are incident on the liquid crystal light bulbs 904R, 904G, and 904B. The liquid crystal light bulbs 904R, 904G, and 904B modulate the light fluxes incident thereon in accordance with image information. The projection lens 908 then enlarges images formed by the liquid crystal light bulbs 904R, 904G, and 904B and projects the images on a screen (display surface) 910.

The projector 900 can further include a cross dichroic prism (light combiner) 906, which combines the light fluxes outputted from the liquid crystal light bulbs 904R, 904G, and 904B with one another and guides the combined light to the projection lens 908.

The color light fluxes modulated by the liquid crystal light bulbs 904R, 904G, and 904B are incident on the cross dichroic prism 906. The prism is formed by bonding four rectangular prisms to each other, and a dielectric multilayer film that reflects the red light and a dielectric multilayer film that reflects the blue light are disposed in the form of a cross on the inner surfaces of the bonded prisms. The dielectric multilayer films combine the three color light fluxes with one another to form light representing a color image. The combined light is then projected by the projection lens 908, which is a projection system, on the screen 910, and an enlarged image is displayed.

In the example shown in FIG. 15, light fluxes that exits through the second light exiting surfaces 172 provided on the second side surfaces 106b are not drawn. The light fluxes may be caused to be incident on reflectors and lens arrays that are not shown and then incident on the liquid crystal light bulbs 904R, 904G, and 904B.

The projector 900 can include the light emitting devices 200, each of which allows a decrease in gain saturation and hence an increase in the output. The projector 900 therefore allows an increase in the luminance of the outputted light.

The projector 900 has a configuration in which the light emitting devices 200 are disposed immediately downstream of the liquid crystal light bulbs 904R, 904G, and 904B and the lens arrays 902R, 902G, and 902B are used to simultaneously perform light focusing and uniform illumination (backlight configuration). Therefore, in the projector 900, the amount of loss in the optical system and the number of parts can be reduced.

In the example described above, transmissive liquid crystal light bulbs are used as the light modulators. Instead, light bulbs using no liquid crystal material or reflective light bulbs may be used. Examples of such light bulbs may include a reflective liquid crystal light bulb and a digital micromirror device. Further, the configuration of the projection system is changed as appropriate in accordance with the type of the light bulbs to be used.

Further, the invention is also applicable to a light source apparatus of a scanning-type image display apparatus (projector) including a scanner that is an image forming device for displaying an image of a desired size on a display surface by scanning the screen with the light fluxes from the light sources 200R, 200G, and 200B.

In the invention, part of the configuration thereof may be omitted and the embodiment and the variation may be combined with each other to the extent that the features and advantageous effects described in the present application are provided.

The invention encompasses substantially the same configuration as the configuration described in the embodiment (for example, a configuration having the same function, using the same method, and providing the same result or a configuration having the same purpose and providing the same effect). Further, the invention encompasses a configuration in which an inessential portion of the configuration described in the embodiment is replaced. Moreover, the invention encompasses a configuration that provides the same advantageous effect as that provided by the configuration described in the embodiment or a configuration that can achieve the same purpose as that achieved by the configuration described in the embodiment. Further, the invention encompasses a configuration in which a known technology is added to the configuration described in the embodiment.

5. Modification

Embodiments of the invention are not limited to the above-described embodiments, and, for example, the following modification is possible.

(1) Modification 1

In the above-described embodiments, the contact layer 110 may be provided in at least a part of the ridge section in the plan view, and may be formed only in the connection area 130. The laminated body 101 has an insulation area in the ridge section 128 in the plan view. The contact layer 110 is not formed in the insulation area 130. In the modification 1 described above, it can be reduced that the current injected to the contact layer 110 is diffused to the surface direction of the contact layer 110.

The entire disclosure of Japanese Patent Application No. 2015-160340, filed Aug. 17, 2015 is expressly incorporated by reference herein.

What is claimed is:

1. A light emitting device comprising:
a laminated body having an active layer capable of producing light when current is injected thereinto and a first cladding layer and a second cladding layer that sandwich the active layer; and
a first electrode and a second electrode that inject current into the active layer,
wherein the second cladding layer has a ridge section thicker than another portion of the second cladding layer,
the active layer forms an optical waveguide that guides light,
the optical waveguide has a first light exiting surface and a second light exiting surface through which the light exits,
the optical waveguide extends in a direction inclined with respect to a normal to the first light exiting surface and a normal to the second light exiting surface,
the laminated body has a connection area that overlaps with the ridge section when viewed in a direction in which the active layer is laminated on the first cladding layer and is connected to the second electrode,
the ridge section has a first tapered section having a width that increases with distance from a center position that is equidistant from the first light exiting surface and the second light exiting surface toward the first light exiting surface when viewed from the laminated direction and a second tapered section having a width that increases from the center position toward the second light exiting surface when viewed from the laminated direction,
the connection area has a third tapered section having a width that increases from the center position toward the first light exiting surface when viewed from the laminated direction and a fourth tapered section having a width that increases from the center position toward the second light exiting surface when viewed from the laminated direction,
an angle of outer edges of the connection area that specify the width of the third tapered section with respect to a center line of the optical waveguide is greater than an angle of outer edges of the ridge section that specify the width of the first tapered section with respect to the center line when viewed from the laminated direction, and
an angle of outer edges of the connection area that specify the width of the fourth tapered section with respect to the center line is greater than an angle of outer edges of the ridge section that specify the width of the second tapered section with respect to the center line when viewed from the laminated direction.

2. The light emitting device according to claim 1,
wherein the laminated body includes a contact layer provided between the second cladding layer and the second electrode, and
the contact layer is connected to the second electrode.

3. The light emitting device according to claim 1,
wherein the connection area has a shape symmetry with respect to the center position when viewed from the laminated direction, and
the ridge section has a shape symmetry with respect to the center position when viewed from the laminated direction.

4. The light emitting device according to claim 1,
wherein an anti-reflection film is provided on each of the first light exiting surface and the second light exiting surface.

5. The light emitting device according to claim 1,
wherein the optical waveguide is formed of a plurality of optical waveguides.

6. A projector comprising:
the light emitting device according to claim 1;
a light modulator that modulates light emitted from the light emitting device in accordance with image information; and
a projection apparatus that projects an image formed by the light modulator.

7. A projector comprising:
the light emitting device according to claim 2;
a light modulator that modulates light emitted from the light emitting device in accordance with image information; and
a projection apparatus that projects an image formed by the light modulator.

8. A projector comprising:
the light emitting device according to claim 3;
a light modulator that modulates light emitted from the light emitting device in accordance with image information; and
a projection apparatus that projects an image formed by the light modulator.

9. A projector comprising:
the light emitting device according to claim 4;
a light modulator that modulates light emitted from the light emitting device in accordance with image information; and
a projection apparatus that projects an image formed by the light modulator.

10. A projector comprising:
the light emitting device according to claim 5;
a light modulator that modulates light emitted from the light emitting device in accordance with image information; and
a projection apparatus that projects an image formed by the light modulator.

11. The light emitting device according to claim 2,
wherein the contact layer is provided in at least a part of the ridge section, when viewed from the laminated direction.

12. The light emitting device according to claim 11,
wherein the contact layer is provided in the connection area, when viewed from the laminated direction.

* * * * *